United States Patent
MacManus et al.

(10) Patent No.: US 6,364,009 B1
(45) Date of Patent: Apr. 2, 2002

(54) COOLING DEVICES

(75) Inventors: Gerard MacManus; Bruce Fryers, both of Bedfordshire; Nicholas Foley, Musselburgh Midlothian; Michael Tate, Hertfordshire, all of (GB)

(73) Assignee: 3Com Corporation, Santa Clara, CA (US)

(*) Notice: Subject to any disclaimer, the term of this patent is extended or adjusted under 35 U.S.C. 154(b) by 0 days.

(21) Appl. No.: 09/490,989

(22) Filed: Jan. 26, 2000

(30) Foreign Application Priority Data

Nov. 24, 1999 (GB) ................................. 9927793

(51) Int. Cl.⁷ ................................. F28F 7/00
(52) U.S. Cl. ................. 165/185; 165/80.3; 361/697; 174/16.3; 257/719; 454/184
(58) Field of Search ............... 165/80.3, 104.33, 165/185, 80.4; 361/697, 700, 704, 719; 174/16.3; 257/719, 718; 454/184

(56) References Cited

U.S. PATENT DOCUMENTS

| | | | |
|---|---|---|---|
| 4,103,737 A | | 8/1978 | Perkins .................. 165/80 |
| 4,765,397 A | * | 8/1988 | Chrysler et al. ....... 165/104.33 |
| 4,851,965 A | | 7/1989 | Gabuzda et al. ............ 361/383 |
| 5,002,123 A | | 3/1991 | Nelson et al. .............. 165/147 |
| 5,304,846 A | | 4/1994 | Azar et al. .................. 257/722 |
| 5,361,188 A | | 11/1994 | Kondou et al. ............. 361/695 |
| 5,437,328 A | | 8/1995 | Simons ...................... 165/146 |
| 5,731,953 A | | 3/1998 | Sakurai ...................... 361/695 |
| 5,860,472 A | * | 1/1999 | Batchelder ................. 165/185 |
| 5,914,857 A | * | 6/1999 | Johnson et al. ............ 165/80.3 |
| 5,953,209 A | | 9/1999 | Chiu .......................... 361/697 |
| 5,957,194 A | | 9/1999 | Azar .......................... 165/80.3 |
| 5,969,950 A | * | 10/1999 | Tantoush ................... 165/80.3 |
| 6,084,770 A | * | 7/2000 | Wyland ..................... 165/80.3 |
| 6,089,315 A | * | 7/2000 | Lee et al. ................... 165/185 |
| 6,154,368 A | * | 11/2000 | Scofield ..................... 165/80.3 |

FOREIGN PATENT DOCUMENTS

| | | |
|---|---|---|
| EP | 0 034 223 | 3/1980 |
| EP | 0 145 311 | 11/1984 |
| EP | 0 458 500 | 5/1991 |
| EP | 0 463 783 | 6/1991 |
| EP | 0 563 755 | 3/1993 |
| EP | 0 910 235 | 4/1999 |
| FR | 2 605 685 | 10/1986 |
| GB | 2 280 989 | 2/1995 |
| GB | 1 018 623 | 1/1996 |
| GB | 2 296 132 | 6/1996 |
| GB | 2 202 681 | 9/1998 |
| WO | WO 93/06340 | 4/1993 |
| WO | WO 97/38566 | 10/1997 |
| WO | WO 99/14807 | 3/1999 |

\* cited by examiner

*Primary Examiner*—Ira S. Lazarus
*Assistant Examiner*—Terrell McKinnon
(74) *Attorney, Agent, or Firm*—Michaelson & Wallace; Peter L. Michaelson; Janet M. Skafar (57) ABSTRACT

A cooling apparatus for cooling an electrical device 1 using a flow of coolant comprises a cooling unit 3. The cooling unit 3 is in contact with the device 1 and includes a channel 6 for transporting the coolant past the device 1. In a preferred embodiment, the sectional area of the channel 6 decreases between the inlet and the outlet of the channel 6. The velocity of the flow of coolant past the device 1 can be modified, thus improving the efficiency of cooling.

32 Claims, 6 Drawing Sheets

FIG. 15A before

FIG. 15B after

FIG. 16

COOLING DEVICES

The present invention relates to a cooling apparatus, in particular, but not exclusively, to a cooling apparatus for cooling an electrical device.

The invention relates more particularly to electrical devices which perform a processing or memory function, such as any processor (for example a semiconductor or other logic device, an integrated circuit, a microprocessor and the like) or any storage device (for example a mass storage device). Such devices may be in the form of an integrated circuit, possibly mounted on a printed circuit board (PCB). Accordingly, the electrical device may be for electrical equipment, which may typically be a computer, modem, switch, hub or like equipment.

Electrical devices usually generate heat during use. During use, the device may become warm. It is undesirable for the device to become too hot because excessive heat can cause damage to components of the device.

It is known to cool electrical devices in electrical equipment using one or more fans and indeed a cooling fan is often provided in electrical equipment. In a conventional arrangement, electrical devices are arranged within a casing, the fan sucks air through one or more vents in the casing, the air passes over the devices and out of the casing via the fan.

To improve the cooling, heatsinks may be provided on the upper surface of the devices to draw heat away from the device. Conventionally, such heatsinks comprise one or more metal formations attached to the top of the device. The heatsink may comprise vertical fins attached to the upper surface of the device.

However, under many conditions, such arrangements have been found to be inefficient.

It is an object of the present invention to improve the cooling of the electrical device and/or to improve the efficiency of the cooling. One benefit of improving the efficiency of the cooling is that smaller and/or fewer fans could be used to obtain the desired cooling effect.

Furthermore, it has been realised pursuant to the present invention that, in many situations, some of the devices in an item of electrical equipment require more cooling than other devices. In order to cool such equipment sufficiently, a high air flow through the equipment is required. Other devices which require little or no cooling are also subject to the high air flow unnecessarily.

According to a first aspect of the present invention, there is provided a cooling apparatus for cooling an electrical device using a flow of coolant, the apparatus comprising a cooling unit for contact with the device, the cooling unit including a channel for transporting the coolant past the device.

By providing a channel for the flow of coolant past the device, the cooling of the device may be controlled, and can be made more efficient. Thus the efficiency of the cooling apparatus may be increased.

As used herein, it should be understood that the term "channel" should be interpreted broadly to include any passage or channel along which the flow of the coolant may be directed. The term is not restricted to fully enclosed structures (as for example a tube), but also includes structures which are not fully enclosed. The flow of the coolant might be enclosed only on three sides or on two sides: the channel may comprise three surfaces or only two surfaces. It is envisaged that the channel may only comprise a single surface but that surface may serve to effect the desired flow of coolant.

Preferably, the channel comprises an enclosed structure, for example a tube or passageway. Preferably the flow of coolant is enclosed on at least three sides within the channel. In some embodiments of the invention, it will be preferable for the flow of coolant to be enclosed on all sides within the channel.

Preferably, the cooling unit is adapted to increase the flow velocity of the coolant past the device. By increasing the flow velocity, the rate and thus efficiency of cooling of the device can be increased. Thus the same cooling of the device can be achieved using fewer and/or smaller coolant devices, for example fans.

In a preferred embodiment of the invention, the sectional area of the channel varies between the inlet and the outlet of the channel. As the sectional area decreases, the velocity of the coolant, and thus its cooling effect increases.

The sectional area of the channel may decrease linearly from the inlet. Alternatively, a constriction may be formed in the channel, for example corresponding to an area of the device which requires greatest cooling.

Where the area of the channel is reduced in such a way, preferably the channel further includes a diffuser at the outlet of the channel to recover the pressure head and thus improve efficiency. The diffuser is a passage which gradually increases in sectional area downstream and its function is to reduce the velocity of the coolant to recover its head, or at least to attempt to retain the head.

The term "sectional area" preferably refers to a transverse cross section of the channel being substantially perpendicular to the direction of the flow of coolant at that location. Furthermore, unless clear to the contrary from the context "length" preferably refers to a distance substantially parallel to the direction of flow of the coolant, and width preferably refers to a dimension being substantially perpendicular to the "length" and parallel to the upper surface of the device, where appropriate.

Preferably, the cooling unit comprises a directing formation for directing the coolant towards the device. By directing the coolant towards the device, the cooling of the device can be increased.

The directing formation may be provided by a wall of the channel or may include a separate formation, which may be located in the channel or outside the channel.

Preferably, the directing formation comprises a directing surface, the surface being adapted to be angled relative to the direction of the coolant flow. Thus the coolant flow is deflected towards the device, thus increasing the efficiency of the cooling.

Preferably, the directing surface is adapted to be at an angle of between 5° and 85° to the direction of the coolant flow. In a preferred embodiment, the angle is between 5° and 10°. The angle may be less than 45°, 30° or 15°.

The directing surface may comprise a planar surface or may be curved, depending on the size and type of device to be cooled. A curved directing surface will usually be preferred having regard to the flow of the coolant through the channel. Furthermore, the shape of the directing surface can be adapted so as to direct coolant to specific hot areas of the device.

The size of the cooling unit will be chosen having regard to the size of the device or devices to be cooled. In some embodiments, the height of the cooling unit will be similar to the width of the cooling unit. The width of the cooling unit will, for some embodiments, be chosen to be the same as that of the device to be cooled.

Alternatively, the cooling unit may be smaller than or larger than the device; the cooling unit may extend beyond a surface of the device in one or more directions. Indeed, the cooling unit may extend over more than one device.

Preferably, the apparatus further includes a turbulence formation for generating turbulent flow of the coolant. Turbulent flow gives improved heat transfer from the device and therefore increased cooling. Turbulence may be effected, for example, by increasing the velocity of the coolant flow and/or providing raised areas on the surfaces of the channel. The turbulence may be localised in specific regions of the channel. The turbulence formation may comprise one or more protrusions.

Preferably, the apparatus further includes cooling fins. The cooling fins can increase the turbulence of the coolant flow. Furthermore, the cooling fins provide an increased surface area of the cooling apparatus and thus improved convection of heat from the apparatus. Cooling fins are preferably provided on the inner and/or the outer surfaces of the channel.

Preferably, the walls of the channel are profiled to increase their surface area.

In a preferred embodiment of the invention, the cooling unit is adapted to contact only one device. Thus close control of the cooling of each device of an item of electrical equipment can be effected, with each device receiving only enough cooling. Thus the efficiency of the cooling can be increased.

In alternative embodiments, the cooling unit straddles more than one device. In such arrangements, the cooling unit preferably contacts more than one device.

The cooling apparatus may comprise a plurality of cooling units, each for contact with a separate device. In preferred embodiments of the invention, the cooling units are adapted so that, in use, they cooperate, preferably so that the air flow passes from one cooling unit to the next. Thus the cooling units preferably form a duct passing over the devices.

Preferably, the channel has a flat base. The width of the base of the channel is preferably chosen to be at least 20%, and preferably at least 40%, 50% or 60% of the width of the device to which the cooling unit is to be attached. The flat surface enhances the cooling of the device.

Preferably, the cooling unit is adapted to contact at least 50% of the upper surfaces of the device. Preferably the cooling unit contacts at lest 60%, 70%, 80% or 90% of the upper surface of the device. The cooling unit may contact all of the upper surface of the device. Greater contact area can lead to greater cooling.

Where reference is made herein to "upper", "lower" and similar expressions, preferably it refers to an arrangement in which a device is attached on the top surface of a circuit board and its upper surface is substantially horizontal. It will be appreciated that circuit boards can, in practice, be mounted "sideways" or "upside-down" and that in such arrangements, for example, the "upper" surface of the device will, in fact, be its lowest surface.

Where the apparatus comprises suitable thermally conductive material, heat can flow from the device to the cooling apparatus by conduction, thus increasing the efficiency of cooling of the apparatus. Where the device comprises a chip on a circuit board, preferably the whole of the upper surface of the device is covered by the apparatus. By increasing the area of contact of the cooling unit and the device, the cooling by conduction is increased.

Preferably, the apparatus includes an attachment formation. Preferably the attachment formation is adapted for attaching the cooling unit to the device. Alternatively, the attachment formation is adapted to attach the cooling unit to the PCB or other part of the equipment, for example the casing (or duct). A formation may be provided in the equipment for cooperation with the attachment formation, for example a holder mounted on the PCB. Thus the cooling unit may include an attachment formation, or the attachment formation may be provided by another part of the equipment.

It is envisaged that the cooling apparatus could be attached to the device using adhesive. However, it is thought that in some situations, the use of adhesive may be inappropriate, for example where the device is subject to vibration. Preferably, the attachment formation includes a clip for attaching the cooling unit to the device. The attachment formation may include a resilient protrusion, for example for engagement with a corresponding indent on a surface of the device.

In an alternative embodiment, the cooling unit is attached to the circuit board.

Preferably, the apparatus includes a resilient portion for contact between the cooling unit and the device. Thus the contact, and thus heat transfer between the device and the apparatus can be increased. In a preferred embodiment, the cooling unit includes a resilient contact portion for contact with the device. When the cooling unit is attached to the device, the contact portion is biassed towards a surface of the device, thus improving thermal contact.

Preferably, the cooling unit comprises a heatsink. As indicated above, it is advantageous for heat to be removed from the device by conduction to the cooling apparatus.

Preferably, the apparatus comprises conductive plastics material.

That feature is of particular importance and thus the invention further provides cooling apparatus for cooling an electrical device using a flow of coolant, the apparatus comprising a cooling unit for contact with the device, the apparatus comprising conductive plastics material.

The thermal conductivity of the material is preferably at least 1 W/mK. In preferred embodiments, the thermal conductivity is preferably between 1 W/mK and 20 W/mK. Preferably the thermal conductivity is less than 20 W/mK, 15 W/mK, 10 W/mK or 5 W/mK. That thermal conductivity is surprisingly low for a material to be used for a heatsink. Conventionally, heatsinks comprise high thermal conductivity materials, for example steel or aluminium. Aluminium has a thermal conductivity of about 200 W/mK, and copper about 400 W/mK. It is envisaged that such conventional materials could be used for the heatsinks described herein; such heatsinks can be manufactured, for example, by extrusion, machining or casting. Preferably, however, filled plastics material is used to form the cooling units. While the materials have low conductivity, the conductivity has been found to be sufficient to give acceptable conduction from the devices. Furthermore, the materials are light and can be easy to injection mould into complex shapes.

The thermally conductive plastics material is the preferred material for the heatsinks, however, because it can be injection moulded. All of the examples of heatsinks described below can be injection moulded in one piece, thus giving lower manufacturing costs for mass production. The use of plastics materials has also been found to give great flexibility and potential for different heatsink shapes and fixing arrangements.

Preferably, the apparatus is formable in one piece, preferably by injection moulding. Preferably the cooling unit is formable by injection moulding in one piece. While it is envisaged that the cooling units can be made in several pieces and subsequently joined, the cost of manufacture and assembly of the cooling apparatus can be reduced if a one-piece cooling unit is used.

By forming the cooling apparatus of conductive plastics material, the cooling apparatus can be moulded, in particular injection moulded while still being sufficiently thermally conducting to conduct heat away from the device at an acceptable rate.

In a preferred embodiment, the apparatus comprises a composite material including a material having a relatively higher thermal conductivity in a matrix of a plastics material having a relatively lower thermal conductivity. The conductive plastics material preferably comprises a filled plastics material, preferably a filled resin. Preferred plastics include polypropylene. The filler may include a metallic material, for example aluminium, steel or ferrite, and/or may include a non-metallic material for example graphite or a ceramic material.

Preferably the material includes at least 40%, 50%, 60% or 70% of the filler by weight. Materials including about 40% by weight of the filler material are particularly preferred.

The shape of the particles of the filler material is thought to be important from a consideration of the transfer of heat in the material. It is thought that generally spherical particles of filler material would give the desired even heat transfer. Long fibres of filler material might give undesirable directional heat transfer. However, in some cases, directional heat transfer may be desirable.

In a preferred embodiment of the invention, short fibres of filler material are used, preferably having a length of less than 1 mm, 0.5 mm or 0.2 mm. The width of such particles might be about 0.01 mm. The preferred aspect ratio of the particles is less than about 100, 50 or 10.

Alternatively or in addition, the apparatus may comprise a thermally conductive coating. For example, the apparatus may comprise a material having a low thermal conductivity (which is chosen, for example, for ease of moulding of the apparatus) and including at least a partial coating of a material having a higher thermal conductivity. The coating may include a metallic coating.

Preferably, the cooling unit comprises conductive plastics material. Thus heat from the device is lost by conduction to the cooling unit, thus cooling the device.

Preferably, the cooling unit comprises a channel and the walls of the channel comprise conductive plastics material. Thus heat from the device moves by conduction into the walls of the channel where is it lost by convection in the coolant flow.

Thus it will be seen that the cooling of the device is improved.

The invention also provides cooling apparatus for cooling an electrical device using a flow of coolant, the apparatus comprising a formation for modifying a flow of coolant past the device.

Preferably the cooling apparatus further comprises a duct for transporting coolant past the cooling unit and the device.

The duct may, for example, simply comprise a space through which the coolant may flow, for example between the PCB on which the device is mounted and the equipment casing. Alternatively, or in addition, a separate passageway may be provided, for example by using one or more baffles.

Preferably the sectional area of the duct varies along its length. Thus the flow of coolant can further be controlled by selecting the shape of the duct. For example, the duct may include constrictions, at which the velocity of the coolant flow, and thus the cooling, is increased. Thus, for a particularly "hot" device, the device could be provided with a cooling unit and, furthermore, be located in the region of the constriction in the duct so that the velocity of the coolant flow over the hot device is much increased, giving a high rate of cooling.

Preferably, the apparatus comprises a plurality of cooling units in the duct.

Preferably the apparatus further comprises a fan.

Where reference is made herein to the use of a fan, that term is to interpreted broadly to include all devices suitable for effecting flow of the coolant.

Preferably the coolant is air. It is, however, envisaged that other fluids could be used. For example, the coolant could comprise water or benzene. A suitable apparatus for effecting the flow of coolant would be used.

Preferably, the fan is arranged to suck air through the duct. It is thought that the sucking of air through the duct gives better flow of the air than would be obtained than if the fan were arranged to blow air through the duct.

Preferably, the apparatus further comprises a plurality of electrical devices.

The invention further provides electrical equipment comprising a cooling apparatus as described above.

The invention further provides a method of cooling an electrical device using a flow of air, using a cooling apparatus as described above.

Apparatus features may be applied to the method features and vice versa. The various features of the different aspect of the invention may be applied interchangeably to other aspects of the invention. Furthermore, each feature disclosed in the description, the claims and/or the drawings may be provided independently or in any appropriate combination.

Embodiments of the present invention will now be described, purely by way of example, with reference to the accompanying drawings, in which.

Figure 1:
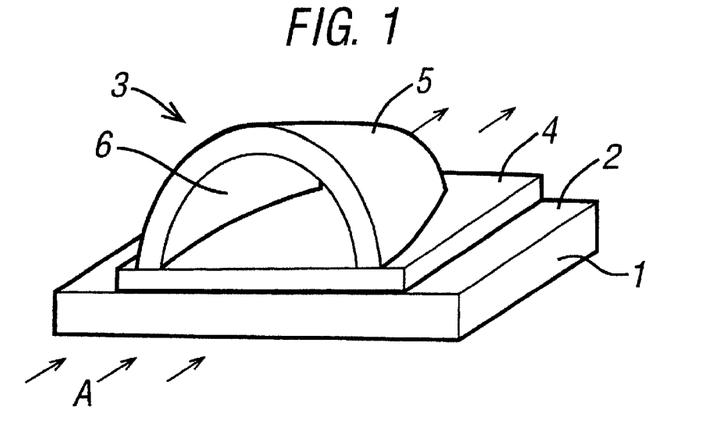
FIG. 1 shows a perspective view of a first example of cooling apparatus attached to an electrical device.

FIG. 1 shows an electrical device 1, in this case a semiconductor chip. The device 1 is attached to a circuit board of electrical equipment (not shown). On the upper surface 2 of the device is attached a cooling apparatus, which in this example comprises a cooling unit 3 comprising a thermally conductive plastics material. In the example shown in FIG. 1, the cooling unit 3 is a heatsink and is attached to the device 1 using a suitable adhesive, for example a trade pressure sensitive adhesive. As described below, the cooling unit could be fastened to the device, the PCB, a duct or casing and/or to a formation provided, for example, on the PCB or other part of the equipment.

The cooling unit 3 comprises a contact portion 4 and an air directing formation 5. In the example of FIG. 1, the contact portion comprises a generally rectangular slab of conductive plastics material, the dimensions of which are such that the contact portion covers the majority of the upper surface 2 of the device. The thermal conductivity of the contact portion 4 is sufficient that heat in the device is conducted into the contact portion. The air directing formation 5 comprises a curved surface on the contact portion 4 to define a tapering channel 6 of generally D-shaped cross-section. The length of the channel extends almost the whole length of the contact portion; the width of the channel varies along its length but is such that the channel covers about one third of the upper surface of the contact portion 4.

The air directing portion 5 of FIG. 1 also comprises thermally conductive plastics material and thus heat is conducted from the contact portion 4 into the walls of the air directing portion 5.

In use, the device and the cooling unit 3 are located in an air flow A. The air flow may be provided by fans as described in more detail below. As the air passes through the channel 6, the contact portion and the air directing portion 5 are cooled by convection. Thus heat is lost from the cooling unit and the device 1 is cooled. Not all of the air flow A enters the channel and the air flow also cools the outer surfaces of the air directing portion 5 and the contact portion 4.

As the air passes through the channel 6, it will increase in temperature as heat is lost from the heatsink. Thus, if the channel were of constant width, the downstream portions of the device would receive less cooling than the upstream portions. It will be seen from FIG. 1 that the inlet of the channel is larger than the outlet of the channel. Thus the area of the channel decreases along its length. Thus, the air flow entering the channel 6 will increase in velocity along the channel as it passes over the device 1. As the velocity of the air flow increases, its cooling effect increases., thus increasing the cooling effect of the air flow at the downstream part of the device and thus increasing the overall cooling of the device. Furthermore, in this way, the effective velocity of air flow at the device is greater than that provided by the fan and thus a smaller fan can be used to effect the same cooling of the device as for a larger fan.

The thermally conductive plastics material of the cooling unit 3 of FIG. 1 comprises a polypropylene matrix having a thermal filler, in this case ceramic powder. The thermal conductivity of the plastics material is about 1 W/mK.

Suitable materials include the following:

| Filler | Matrix | Approximate Thermal Conductivity (W/mK) |
|---|---|---|
| ceramic powder | polyphenylene sulphide | 1.0 |
| ceramic powder + graphite | polyphenylene sulphide | ~4.6 |
| ceramic powder | polypropylene | 1.2 |
| ceramic powder + glass fibre | nylon | 1.0 |

The amount of filler in the material is about 40% by weight.

The heatsink 3 of FIG. 1 is injection moulded in one piece. In an alternative arrangement, the contact portion 4 is formed separately from the air directing portion 5 and the two parts are subsequently joined.

Figure 2:
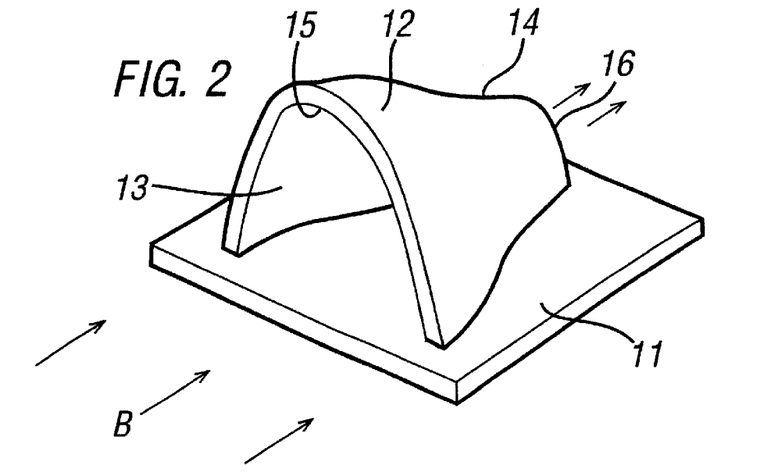
FIG. 2 shows a perspective view of a second example of cooling apparatus.

FIG. 2 shows a second example of a cooling apparatus and the direction B of air flow through the apparatus. The apparatus of FIG. 2 is similar to that of FIG. 1 in that it includes a contact portion 11 and an air directing formation 12. The air directing formation again comprises a channel 13, but the tapering of the channel from the inlet to the outlet is not linear as it is in the apparatus of FIG. 1. Instead the channel 13 includes a neck 14 between the inlet 15 and the outlet 16. The velocity of the air flow downstream of the neck 14 is substantially greater than that upstream of the neck 14, giving rise to greater cooling downstream. Thus the airflow "caught" in the channel and is accelerated over the middle of the upper surface of the device; thus greater cooling is provided at that area of the device which is often the hottest region and thus requires the greatest cooling.

Figure 3:
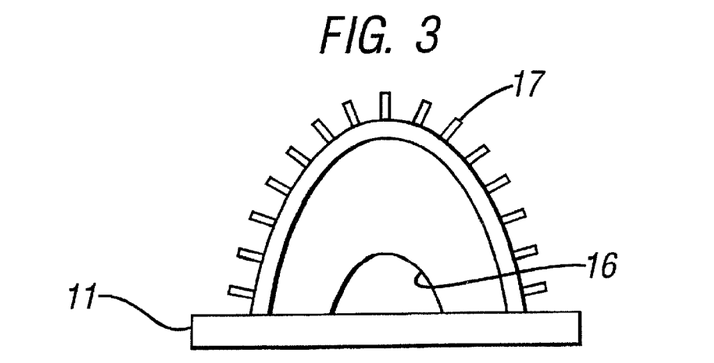
FIG. 3 shows an end view of the cooling apparatus of FIG. 2.

FIG. 3 shows a variant of the apparatus of FIG. 2. The outer surface of the channel includes fins 17. Not all of the air flow B enters the channel 13; the air which proceeds around the outside of the channel passes over the outer surface of the channel, cooling the channel by convection. By increasing the surface area of the outer surface of the channel by providing fins 17, the amount of heat lost by convection can be increased. In the arrangement shown in FIG. 3, the fins 17 extend along the length of the air directing formation 12, but a different arrangement could be used.

Figure 4:
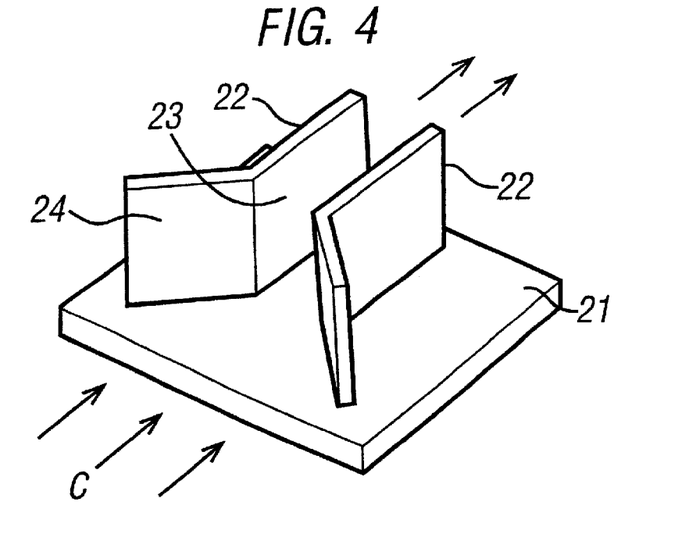
FIG. 4 shows a perspective view of a third example of cooling apparatus.

FIG. 4 shows a third example of the cooling apparatus. The cooling apparatus includes a contact portion 21 and a pair of cooling fins 22. The direction of air flow C is shown and the cooling fins 22 form an open channel through which the air flows. Downstream, the cooling fins 22 are substantially parallel to the direction of air flow C, forming a parallel-sided channel portion 23. At the upstream end of the channel, the fins are flared outwards. The flared portion 24 of the channel acts as a funnel, directing the air flow into the parallel-sided channel 23. The flared portion 24 also aids in increasing the velocity of the air in the channel, thus increasing the cooling by convection. The cooling fins 22 and the contact portion 21 comprise conductive plastics material and are formed in one piece by injection moulding.

Figure 5:
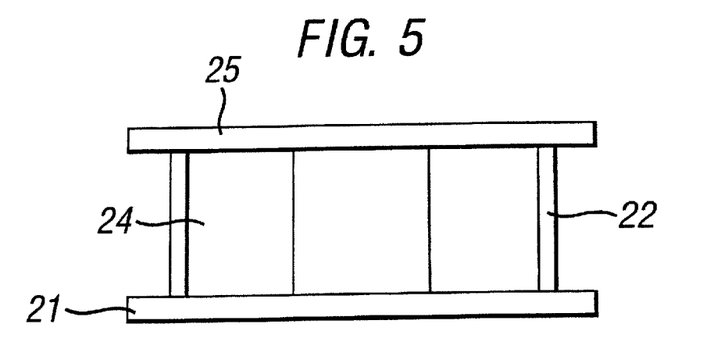
FIG. 5 shows an end view of a variant of the third example of FIG. 4.

FIG. 5 shows a variant of the cooling apparatus of FIG. 4. The shape of the cooling fins 22 is the same as that in FIG. 4, but a roof 25 is provided on top of the cooling fins which covers the channel 23 to form a closed channel which is bounded by the roof 25, the cooling fins 22 and the contact portion 21. The roof also comprises conductive plastics material and is formed in one piece with the fins 22 and contact portion 21.

Figure 6:
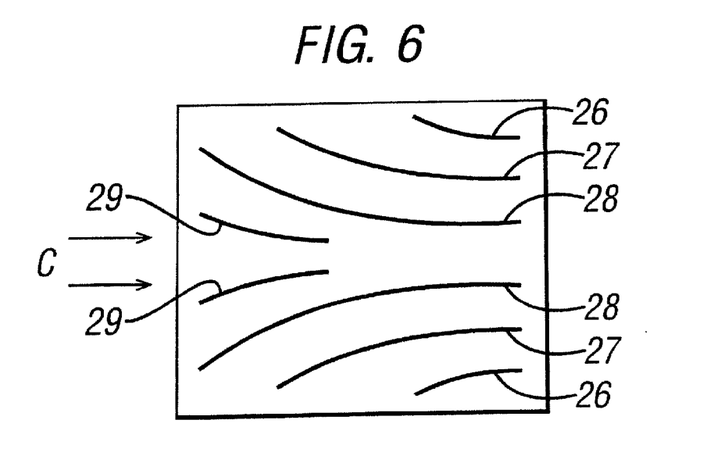
FIG. 6 shows a plan view of a further variant of the third example of FIG. 4.

FIG. 6 shows a further alternative of the third example of the cooling apparatus. The apparatus includes four pairs of cooling fins 26, 27, 28 and 29, which are nested to provide several channels for the air flow. The cooling fins have a curved shape and the distance between the two fins of the pairs of fins is greater at the upstream end of the apparatus than at the downstream end. Thus the air flow C is directed by the fins and the velocity of the air flow over the device is increased, thus increasing the cooling by convection. The arrangement of FIG. 6 may or may not have a roof.

Figure 7:
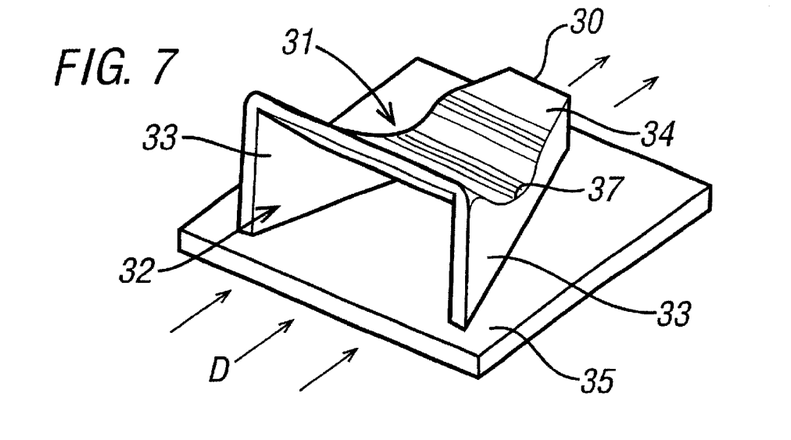
FIG. 7 shows a perspective view of a fourth example of cooling apparatus.

FIG. 7 shows a closed channel arrangement in air flow D. The air directing formation 31 includes an inlet 32 having a generally rectangular shape. The side walls 33 of the air directing formation 31 taper from the inlet 32 to the outlet 30, decreasing the width of the channel. Furthermore, the height of the roof 34 above the contact portion 35 varies along the length of the channel. Thus the sectional area of the channel changes from the inlet to the outlet of the channel, thus varying the velocity of the air flow and the cooling of the device.

Figures 8, 9:
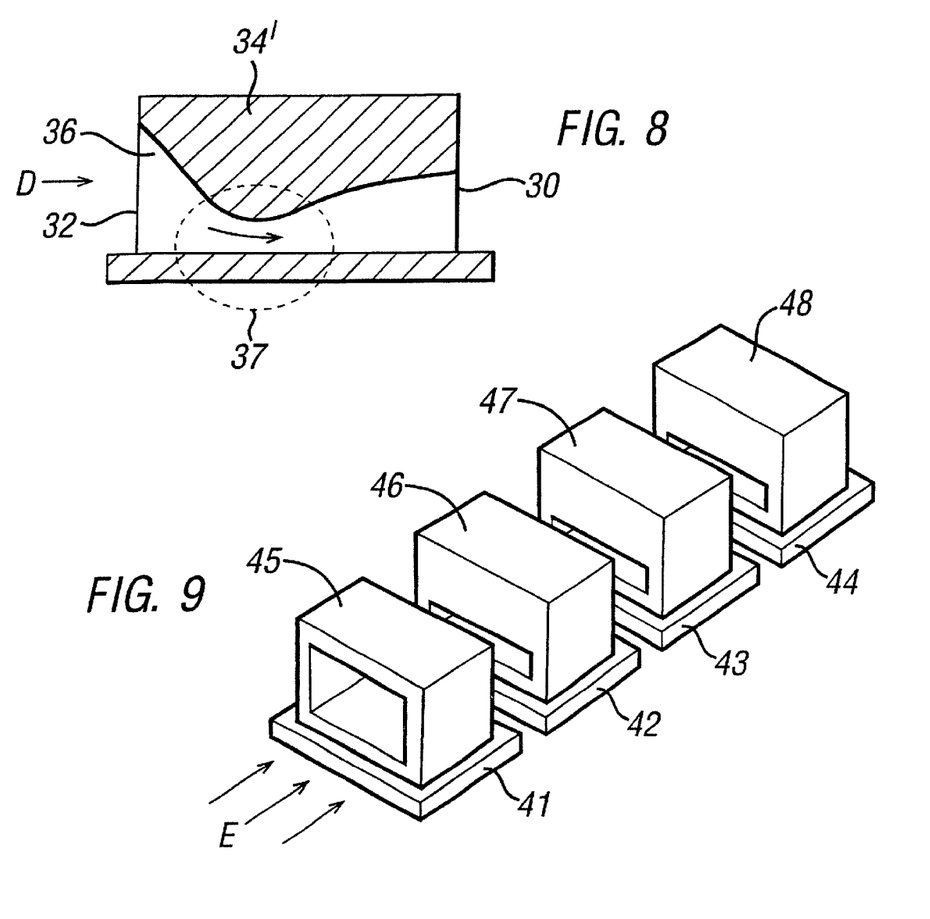
FIG. 8 shows a sectional side view of a variant of the cooling apparatus of FIG. 7.
FIG. 9 shows a perspective view of a fifth example of cooling apparatus.

FIG. 8 shows a side sectional view of a variant of the cooling apparatus of FIG. 7 in which the air directing formation 31 comprises a thick solid roof 34' to aid conduction.

As can be seen from FIG. 7 and 8, the channel includes a nozzle portion 36 at the inlet 32 of the air flow D. The height and width of the channel 33 decrease from the inlet 32 to a neck 37. The decrease in the dimensions of the channel increases the velocity of the air flow in the channel and causes jet impinging at the neck 37 which gives a fast air flow, and increased cooling, over the centre region of the device. Past the neck 37, the height of the channel increases towards the outlet 30, thus reducing the velocity of the air flow.

Figure 10:
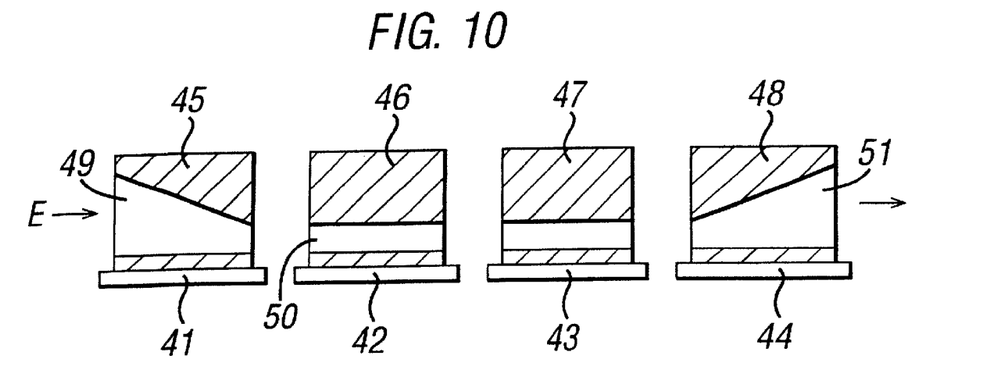
FIG. 10 shows a sectional side view of the fifth example of FIG. 9.

FIGS. 9 and 10 show a fifth example of the cooling apparatus. In this example, the air directing channel is spread across four devices 41, 42, 43 and 44 in air flow E. The cooling apparatus comprises four cooling units 45, 46, 47 and 48, each secured to the upper surface of one of the devices. The first cooling unit 45 furthest upstream comprises a channel 49 having a generally constant width; but the height of the channel reduces from the inlet to the outlet. In the first cooling unit 45, the air flow is captured and the velocity of the flow in the channel 49 is increased from the inlet to the outlet, thus improving cooling.

The second cooling unit 46, adjacent the first, includes a channel 50 of generally constant height and width. The high velocity air from the first channel 49 passes into the second channel 50 and the high velocity air gives good cooling by convection of the second device 42. The third cooling unit 47 is similar to the second cooling unit 46 and the high velocity air passes from the second cooling unit 46 to the third cooling unit 47 to cool the third device 43. The fourth cooling unit 48 is similar to the first cooling unit 45 but is arranged so that the height of the channel 51 increases from the inlet to the outlet. As the high velocity air passes from the inlet to the outlet, velocity head is transformed into pressure head.

Thus the first and fourth cooling units 45, 48 could be the same, but mounted in a different orientation.

FIGS. 9 and 10 show the channel extending across four devices. A similar arrangement could be used spanning fewer or more devices, for example six cooling units on six devices. The width and height profiles of the individual cooling units and their channels will be chosen having regard to the desired air flow through the channel and the devices to be cooled.

The cooling units might not be arranged rectilinearly, and the channels could be shaped to direct the air to the adjacent downstream cooling unit.

Figure 11:
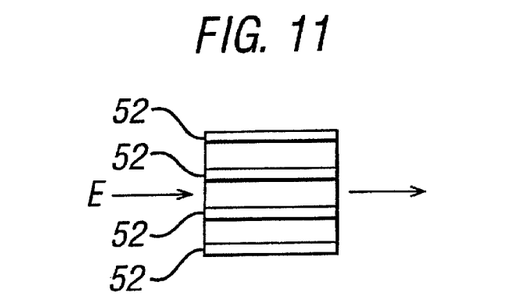
FIG. 11 shows a plan view of a part of a variant of the fifth example of FIGS. 9 and 10.

FIG. 11 shows the upper surface of a cooling unit for use in an arrangement of the type shown in FIGS. 9 and 10. The upper surface includes cooling fins 52 which increase the surface area of the cooling unit, thus improving convection from the outer surface of the cooling unit. Some or all of the cooling units could be provided with such fins, in particular if the device associated with the cooling unit is especially hot and requires additional cooling. The fins can be provided on any surface of the cooling unit, as appropriate.

Figure 12:
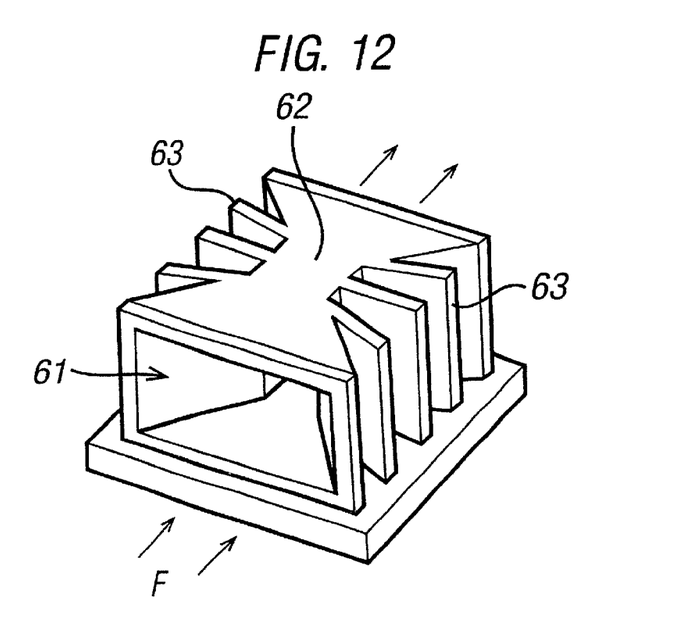
FIG. 12 shows a perspective view of a sixth example of cooling apparatus.

FIG. 12 shows a fifth example of the cooling arrangement. The arrangement comprises a channel 61 having a generally constant height. The width of the channel decreases from the inlet to a central portion 62, corresponding to the central region of the device, and then increases from the central portion 62 to the outlet. Thus air entering the channel increases in velocity from the inlet to the central portion, the region of highest velocity corresponding to the central region of the device, which normally requires the greatest cooling.

Cooling fins 63 are provided on the exterior surfaces of the central portion to further increase the cooling by increasing the surface area of the outer surfaces of the cooling unit and thus the amount of heat lost by convection.

Alternative shapes of the channel and shape and arrangement of the cooling fins could be used.

Figure 13:
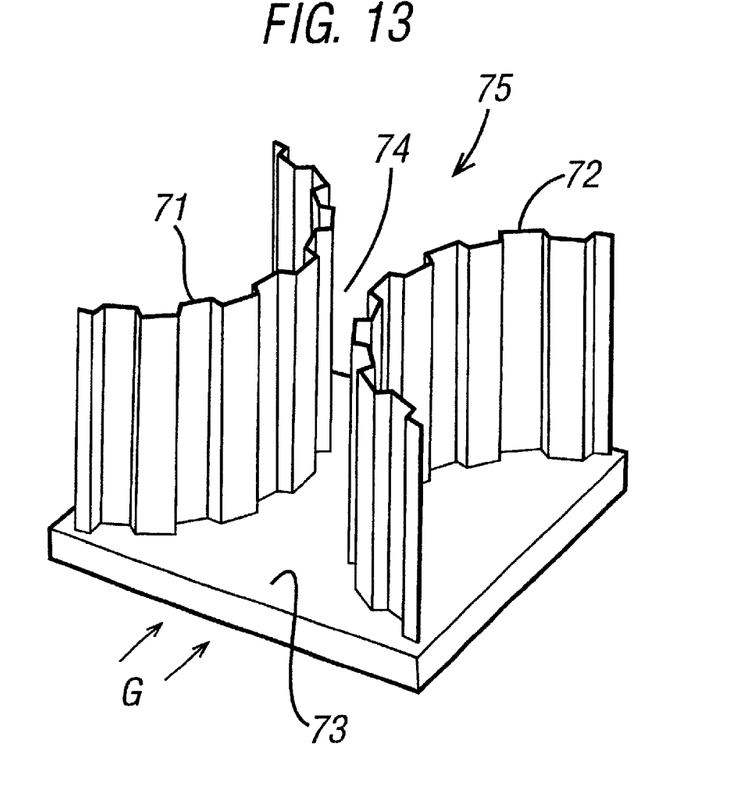
FIG. 13 shows a perspective view of a seventh example of cooling apparatus.
Figure 14:
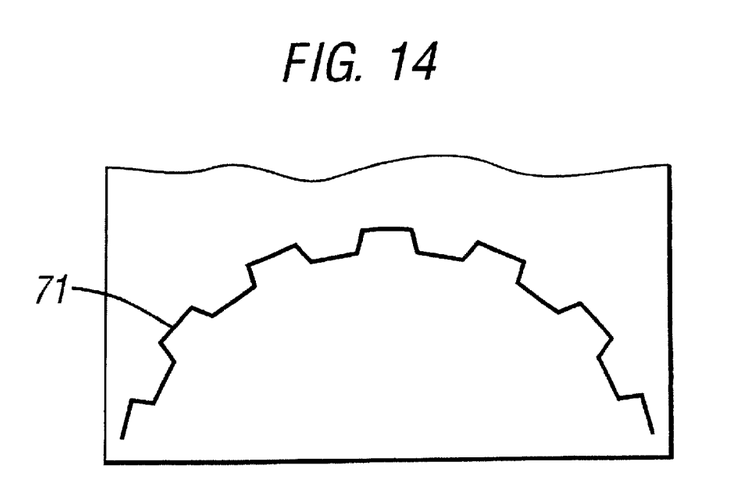
FIG. 14 shows a plan view o,f a portion of the seventh example of FIG. 13.

FIG. 13 shows an open channel arrangement in which the side walls of the channel are formed by two curved cooling fins 71 and 72. The distance between the cooling fins decreases between the inlet 73 and a central portion 74 and increases from the central portion 74 to the outlet 75 to give a increased air velocity and thus greater cooling by the air at a the central portion 74, which is a region corresponding to the centre of the device. The surfaces of the cooling fins 71, 72 include vertical crenellations or ribs as shown in FIG. 14. The shaping of the cooling fins increases the surface area of the fins and thus improves convection. Also the shaped surface can help to generate localised eddies which enhance cooling.

The cooling units may be attached to the devices in any appropriate way. For example, the cooling units may be attached to the upper surface of the device using a suitable adhesive.

Alternatively, or in addition, the cooling unit may be mechanically fastened, for example clipped, to the device, the PCB, or other part of the equipment, for example a duct or casing. A formation may be provided for cooperation with the cooling unit to assist in the attachment.

Figure 15A:
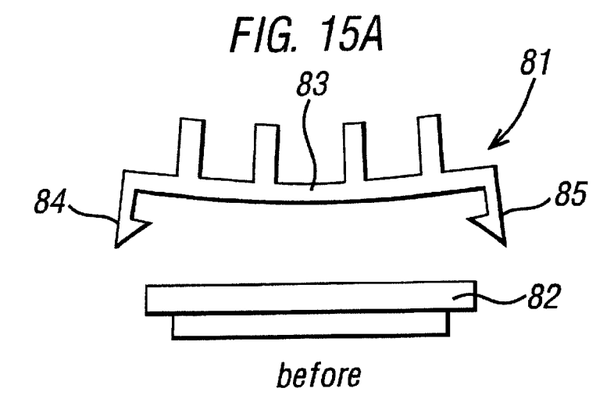
FIG. 15A shows a side view of cooling apparatus and a device.
Figure 15B:
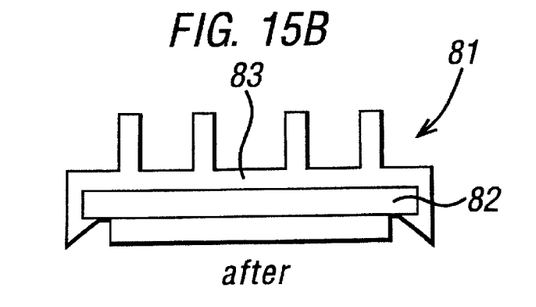
FIG. 15B shows a side view of the cooling apparatus attached to the device of FIG. 15A.

FIGS. 15A and 15B show a mechanism for attaching a cooling unit 81 to a device 82. The contact portion 83 includes two clips 84, 85 each having a formation which, as shown in FIG. 15B are dimensioned to clip around a part of the device 82. The contact portion comprises compliant material and, as shown in FIG. 15A the contact portion is convexly curved. When the cooling unit 81 is attached to the upper surface of the device 82 and the clips 84, 85 are located around the device 82, the contact portion straightens to correspond to the flat upper surface of the device. However, the original curvature of the contact portion causes the centre of the contact portion to be biassed towards the upper surface of the device, thus providing better contact between the contact portion and the device and giving improved conduction of heat from the device to the cooling unit.

FIGS. 15A and 15B show a cooling unit having clips for engagement with the device. In an alternative arrangement, the clips of the cooling unit are arranged to engage with a formation on the circuit board.

Figure 16:
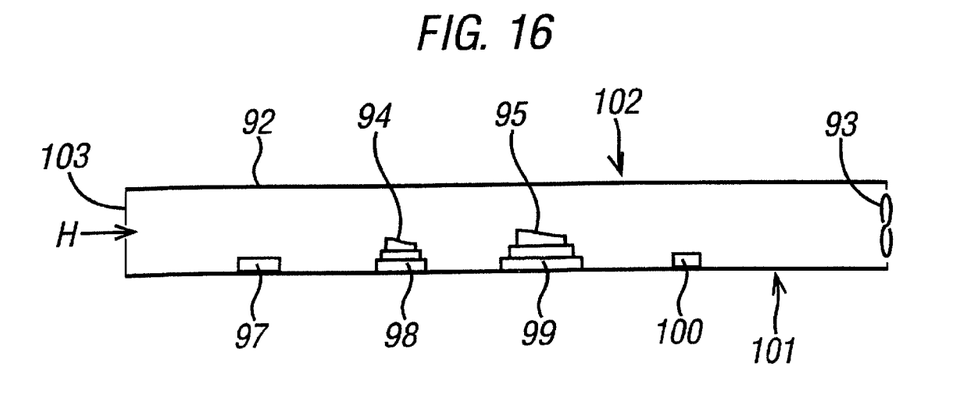
FIG. 16 shows a device and cooling apparatus mounted in a duct.

FIG. 16 is a schematic representation of four electrical devices 97, 98, 99 and 100 mounted on a circuit board 101 in electrical equipment. The equipment includes a duct 92 and a fan 93 for drawing air through the duct in direction indicated as H. The duct 92 is bounded by the circuit board 101 below, and the casing 102 of the equipment above and to the sides. The casing of the equipment includes a grille 103 through which air passes into the duct.

While one fan 93 is shown, more than one fan may be used to suck air through the duct; alternatively, or in addition, one or more fans may be located adjacent the inlet of the duct 92 for pushing air through the duct. The fan 93 is a 40 mm by 20 mm axial fan having a flow rate of 5.4 cfm (0.0025 m$^3$/s).

Devices 98 and 99 include have cooling apparatus comprising cooling units 94 and 95 on their upper surfaces. Those cooling units may be any of the designs described above, or other designs. Devices 98 and 99 are devices which can become particularly hot and more cooling of devices 98 and 99 is required than for devices 97 and 100 which produce less heat. Thus it will be seen that devices 97 and 100 do not include cooling units. Thus additional cooling of the hot devices 98 and 99 can be provided by the cooling units 94 and 95. Thus the air flow in the duct 92 is able to be reduced compared with the case in which no cooling units are used. Thus a smaller fan 93 can be used than might otherwise have been required.

Tests were carried out to assess the use of a thermally conductive plastic heatsink on a device. In a first test the temperature of an electrical device (576TBGA) having no heatsink was determined. The device was located in a duct having a fan with a flow rate of 0.002 m$^3$/s. The temperature of the device was found to be 94.3° C.

A heatsink was subsequently attached to the upper surface of the same device. The material of the heatsink comprised 60% by weight iron in a polycarbonate matrix. The thermal conductivity of the heatsink material was about 10.16 W/mK. The wall thickness of the heatsink was 2 mm. The temperature of the device was found to be 87.3° C.

The observed 7° C. reduction of temperature was in this case sufficient that one fewer fan is required to cool the device.

As a comparative test, a heatsink comprising polycarbonate only was used. An increase in temperature of 4° C. was seen compared with the arrangement having no heatsink.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. A cooling apparatus for cooling an electrical device using a flow of coolant, the apparatus comprising a cooling unit for contact with the device, the cooling unit comprising a channel for transporting the coolant past the device, wherein the cooling unit comprises only one channel, the channel having an inlet and an outlet and wherein the sectional area of the channel decreases between the inlet and the outlet, the cooling unit having a top and a base, the base having a contact portion for contacting the device, the contact portion having a convex shape, the top of the cooling unit comprising an exterior surface having fins.

2. Apparatus according to claim 1, wherein the cooling unit is adapted to increase the flow velocity of the coolant past the device.

3. Apparatus according to claim 2, wherein the sectional area of the channel decreases between the inlet and the outlet of the channel.

4. Apparatus according to claim 1, wherein the cooling unit further comprises a directing formation for directing the coolant towards the device.

5. Apparatus according to claim 4, wherein the directing formation comprises a directing surface, the surface being adapted to be angled relative to the direction of the coolant flow.

6. Apparatus according to claim 5, wherein the directing surface is adapted to be at an angle of between 5° and 10° to the direction of the coolant flow.

7. Apparatus according to claim 1, wherein the apparatus further comprises a turbulence formation for generating turbulent flow of the coolant.

8. Apparatus according to claim 1, wherein the cooling unit further comprises clips to bias the contact portion towards the device to improve thermal contact with the device.

9. Apparatus according to claim 1, wherein the cooling unit is adapted to contact only one device.

10. Apparatus according to claim 1, wherein the cooling unit is adapted to contact at least 50% of the upper surfaces of the device.

11. Apparatus according to claim 1, wherein the apparatus further comprises an attachment formation.

12. Apparatus according to claim 1, wherein the contact portion is resilient.

13. Apparatus according to claim 1, wherein the cooling unit comprises a heatsink.

14. Apparatus according to claim 1, wherein the apparatus comprises conductive plastics material.

15. Apparatus according to claim 1, further comprising a duct for transporting coolant past the cooling unit and the device.

16. Apparatus according to claim 15, further comprising a plurality of cooling units in the duct.

17. Apparatus according to claim 15, further comprising a fan.

18. Cooling equipment according to claim 15, further comprising a plurality of electrical devices.

19. Electrical equipment comprising a cooling apparatus according to claim 1.

20. Method of cooling an electrical device using a flow of air, using a cooling apparatus according to claim 1.

21. Apparatus according to claim 1, wherein the top of the cooling unit comprises walls and a roof such that, when the unit is in contact with the device, the channel for transporting the coolant is substantially closed between the inlet and the outlet.

22. Apparatus according to claim 1, wherein the channel is substantially closed between the inlet and the outlet.

23. Cooling apparatus for cooling an electrical device using a flow of coolant, the apparatus comprising a cooling unit for contact with the device, the cooling unit comprising a channel for transporting the coolant past the device, the cooling unit having a top and a base, the base having a contact portion for contacting the device, the contact portion having a convex shape, the top of the cooling unit comprising an exterior surface having fins, the apparatus comprising conductive plastics material.

24. Apparatus according to claim 23, wherein the apparatus is formable in one piece.

25. Apparatus according to claim 23, wherein the cooling unit comprises clips to bias the contact portion towards the device to improve thermal contact with the device.

26. Apparatus according to claim 23, wherein the thermal conductivity of the conductive plastics material is between 1 W/mK and 20 W/mK.

27. A cooling apparatus for cooling an electrical device using a flow of coolant, the apparatus comprising a cooling unit for contact with the device, the cooling unit comprising a top and a base, the base having a contact portion for contacting the device, the contact portion having a convex shape, the top of the cooling unit comprising an exterior surface having fins, the cooling unit comprising a channel having an inlet and an outlet for transporting the coolant over the device from the inlet to the outlet, the channel being substantially closed and having a constriction between the inlet and the outlet, the sectional area of the channel being greater both upstream of the constriction and downstream of the constriction than at the constriction.

28. A cooling apparatus for cooling an electrical device using a flow of coolant, the apparatus comprising a cooling unit for contact with the device, the cooling unit comprising a channel for transporting the coolant past the device, the cooling unit having a top and a base, the base having a contact portion for contacting the device, the contact portion having a convex shape, the top of the cooling unit comprising an exterior surface having fins, the apparatus further comprising an attachment formation for attaching the unit to the device.

29. Apparatus according to claim 28, wherein the attachment formation comprises a clip.

30. A cooling apparatus for cooling an electrical device using a flow of coolant, the apparatus comprising a cooling unit for contact with the device, the cooling unit comprising a channel for transporting the coolant past the device, the cooling unit having a top and a base, the base having a contact portion for contacting the device, the contact portion having a convex shape, the top of the cooling unit comprising an exterior surface having fins, the contact portion being resilient.

31. Apparatus according to claim 30, wherein the contact portion is adapted to be biased, in use, towards a surface of the device.

32. A cooling apparatus for cooling an electrical device using a flow of coolant, the apparatus comprising a cooling unit for contact with the device, the cooling unit comprising a channel for transporting the coolant past the device, the cooling unit having a top and a base, the base having a contact portion for contacting the device, the contact portion having a convex shape, the top of the cooling unit comprising an exterior surface having fins, wherein the cooling unit is formed in a single piece by injection molding.

\* \* \* \* \*